United States Patent
Zeiger et al.

(10) Patent No.: US 6,375,472 B1
(45) Date of Patent: *Apr. 23, 2002

(54) APPARATUS AND METHOD OF MOUNTING A BRACKET APPARATUS TO A CIRCUIT BOARD

(75) Inventors: David R. Zeiger, Palatine; William L. Bollig, Elk Grove Village, both of IL (US)

(73) Assignee: 3Com Corporation, Rolling Meadows, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/266,290

(22) Filed: Mar. 11, 1999

(51) Int. Cl.[7] .......................... H01R 12/00; H01R 9/22; H01R 13/73; H05K 1/00

(52) U.S. Cl. .......................................... 439/61; 439/939

(58) Field of Search .......................... 439/61, 570, 571, 439/572, 573, 939; 200/238; 361/683, 417, 759

(56) References Cited

U.S. PATENT DOCUMENTS

| | | | | |
|---|---|---|---|---|
| 3,971,907 A | * | 7/1976 | Lennon | 200/238 |
| 4,987,517 A | * | 1/1991 | Kurz | 361/417 |
| 5,706,179 A | * | 1/1998 | Palatov | 361/788 |
| 5,762,523 A | * | 6/1998 | Clark et al. | 439/573 |
| 5,822,193 A | * | 10/1998 | Summers et al. | 361/759 |

* cited by examiner

Primary Examiner—Brian Sircus
Assistant Examiner—Chandrika Prasad
(74) Attorney, Agent, or Firm—Baniak Pine & Gannon

(57) ABSTRACT

A bracket mounting apparatus includes a bracket body, at least one bracket arm and a rivet-head integrally formed in and extending from the bracket arm to allow the bracket mounting apparatus to be secured to a printed circuit board.

15 Claims, 3 Drawing Sheets

APPARATUS AND METHOD OF MOUNTING A BRACKET APPARATUS TO A CIRCUIT BOARD

FIELD OF THE INVENTION

The invention generally relates to the field of brackets and, in particular, to a bracket which is mounted to a printed circuit board to allow the circuit board to be inserted in an electronic chassis.

BACKGROUND OF THE INVENTION

Electronic chassis for computers, telecommunication, and networking devices typically receive a plurality of circuit board assemblies comprised of a circuit board and a bracket attached to the circuit board. The bracket is typically attached to an end of the circuit board. This allows the circuit board to be inserted in standardized tracks of the electronic chassis.

Various conventional assembly techniques are used to mount the bracket to the circuit board. Typically these assembly techniques require the use of standard fasteners, including screws, riv-screws and rivets. Each of theses assembly techniques, however, has certain drawbacks. For example, using screws, riv-screws or rivets add cost and parts to the assembly process. In addition, screw assembly is difficult to automate and requires the bracket to be threaded. Tiv-screw assembly is typically the most expensive assembly process and requires customized equipment. Use of rivets, riv-screws or screws may also cause assembly delays or defective product when the fasteners are lost or missing during the assembly process.

Accordingly, it would be desirable to have a bracket mounting apparatus that overcomes the disadvantages and inefficiencies described above.

SUMMARY OF THE INVENTION

One aspect of the invention provides a bracket mounting apparatus comprising a bracket body, at least one bracket arm extending outward from the bracket body, and an integrally formed rivet-head extending from the bracket arm to allow the bracket mounting apparatus to be secured to a printed circuit board. The bracket mounting apparatus may preferably include a first and second bracket arm which extends substantially perpendicular from the bracket body. The bracket mounting apparatus may be comprised of steel. The rivet-head may be sized to conform to standardized rivet-head machines. The rivet-head includes a cylindrical body portion including an opening formed therein to receive a rivet punch. Preferably, the bracket body and bracket arms are formed as an integral member.

A further aspect of the invention provides a bracket mounting apparatus comprising a body portion, first and second bracket arm portions extending substantially perpendicular from the bracket body portion. A rivet-head portion extendsfrom each of the first and second bracket arm portions, and the rivet-head portions align with openings formed adjacent an end of a printed circuit board.

A further aspect of the invention provides a method of attaching a bracket mounting apparatus to a printed circuit board. A bracket body, at least one bracket arm extending outward from the bracket body and an integrally formed rivet-head extending from the bracket arm are provided. The rivet-head is passed through an opening in the printed circuit board. The rivet-head is secured to the printed circuit board with a rivet-head machine. The rivet-head may preferably include a cylindrical body portion and an opening formed therein. The rivet punch is inserted into the opening in the rivet-head. The cylindrical body of the rivet-head is bent against the circuit board to secure the bracket mounting apparatus to the circuit board.

The foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENTS

Figure 1:
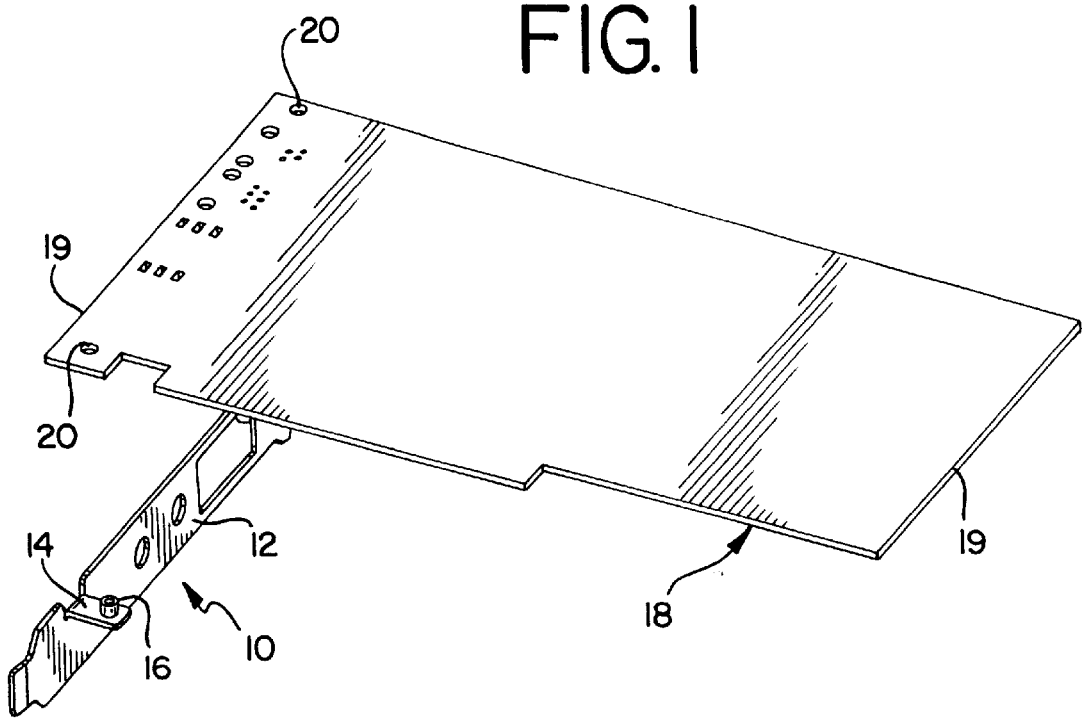
FIG. 1 is an exploded view showing a printed circuit board and a preferred embodiment of a bracket mounting apparatus made in accordance with the invention.
Figure 2:
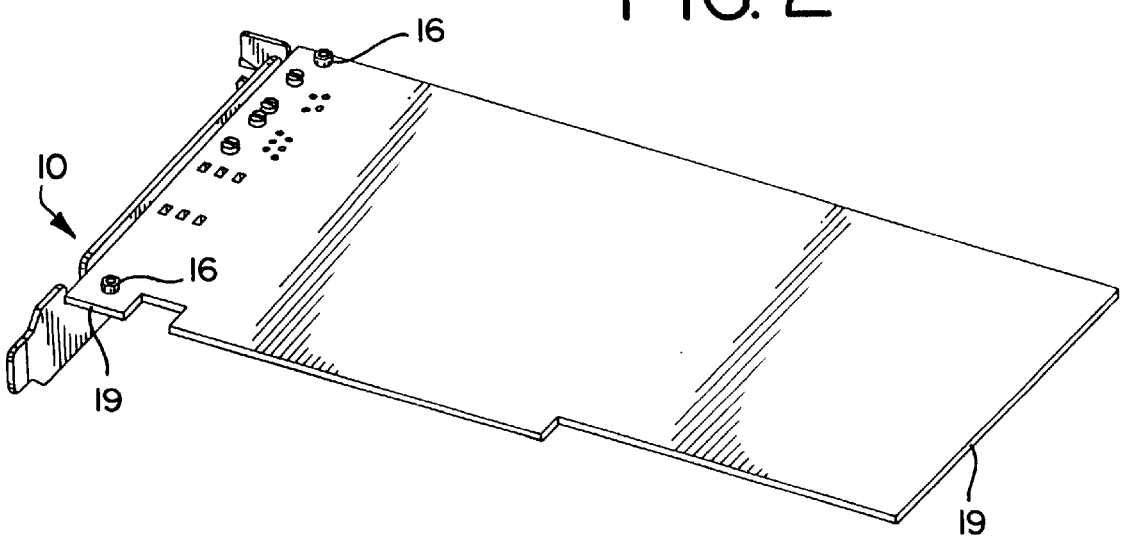
FIG. 2 is a perspective view of the bracket mounting apparatus of FIG. 1 received in openings formed in the printed circuit board.
Figure 3:
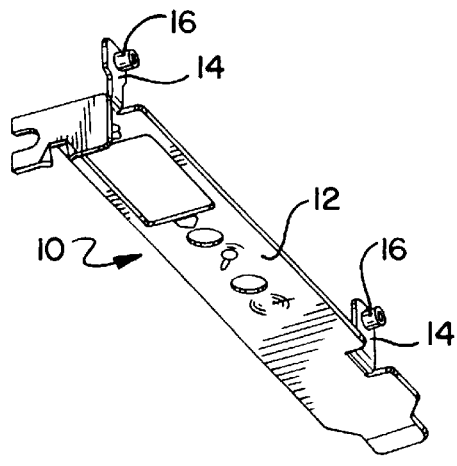
FIG. 3 is a perspective front view of the bracket mounting apparatus of FIG. 1.
Figure 4:
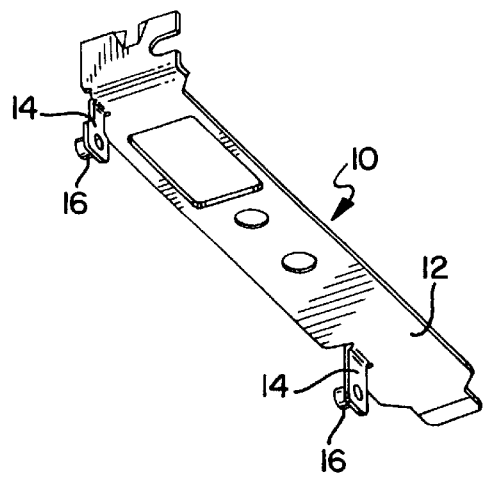
FIG. 4 is a perspective back view of the bracket mounting apparatus of FIG. 3.

Referring to FIGS. 1–4, a preferred embodiment of a bracket mounting apparatus is generally shown at 10, and comprises a bracket body 12, at least one bracket arm 14 extending outward from the bracket body 12, and a rivet-head 16 integrally formed in and extending from the bracket arm 14 to allow the bracket mounting apparatus to be secured to a printed circuit board 18. Once the bracket apparatus 10 is attached to the printed circuit board 18, the resulting assembly may be inserted into, for example, the tracks of a standard computer chassis.

Referring to FIGS. 3, 4, 7 and 8, the bracket mounting apparatus 10 is preferably made of a rigid material, for example, steel. The bracket body 12 and bracket arms 14 may preferably be formed as an integral member. The bracket body 12 may have a length B which spans an end 19 of the printed circuit board 18. The bracket arms 14 preferably extend from the bracket body 12 to align with openings 20 formed through the printed circuit board 18. The openings 20 are positioned adjacent end 19 of the printed circuit board 18. The bracket arms 14 may preferably extend perpendicular to the bracket body 12. As shown in FIG. 9, the rivet-heads 16 may preferably include a cylindrical body portion 17 with an opening 24 formed therein. The rivet-heads 16 preferably extend outward from the bracket arms 14. The rivet-heads 16 may be preferably sized to be used with conventional rivet-head machinery 20.

Figure 5:
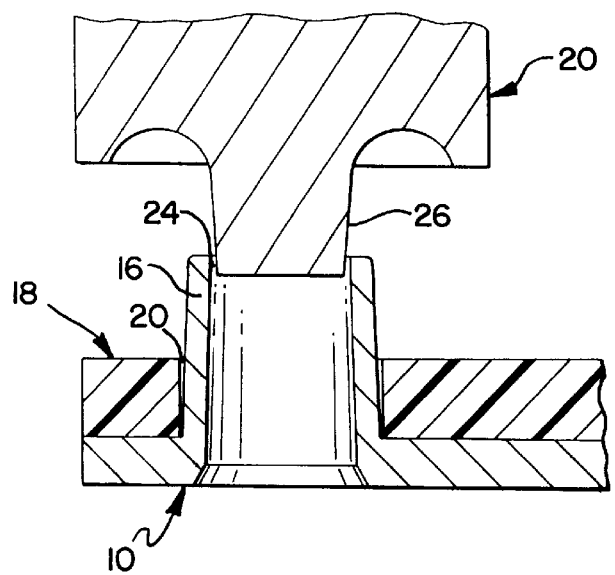
FIG. 5 is a schematic sectional view of the bracket mounting apparatus received in an opening of the printed circuit board, and positioned beneath the standard rivet-head machine.
Figure 6:
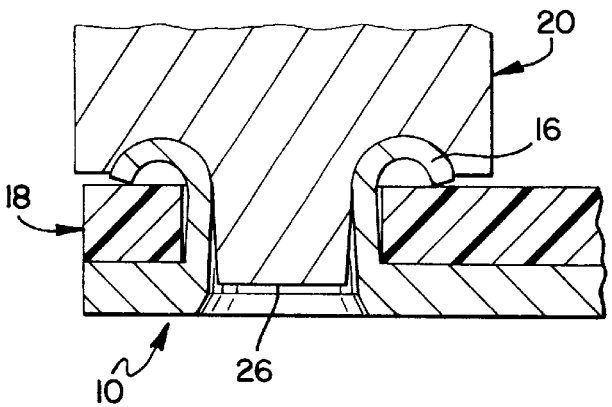
FIG. 6 is a schematic sectional view of FIG. 5 as the bracket mounting apparatus is attached to the printed circuit board with the standard rivet-head machine.

As shown in FIGS. 5 and 6, during the assembly process, the rivet-heads 16 are received in openings 20 formed through the printed circuit board 18. A rivet punch 26 of the rivet-head machine 20 is received in the opening 24 of each rivet-head 16. The rivet-head 16 is bent by the rivet-head machine 20 to fasten the rivet-head 16 to the printed circuit board 18. This process allows the bracket mounting apparatus 10 to be secured to the printed circuit board 18 without the use of separate fasteners, such as, for example, riv-screws, screws or rivets.

Figure 7:
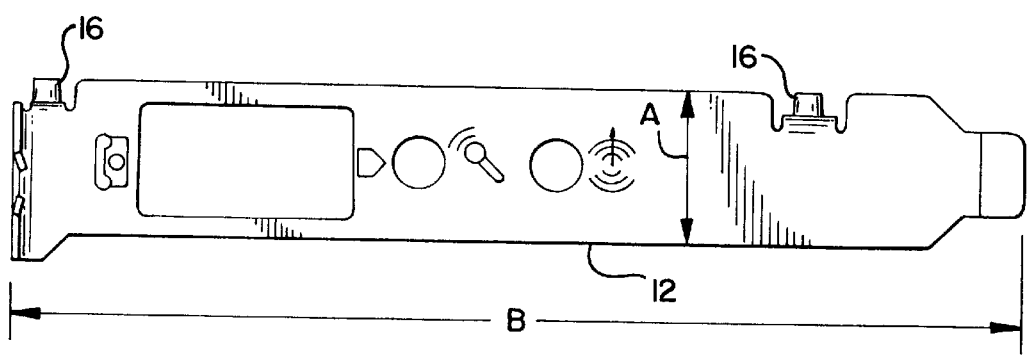
FIG. 7 is a front view of the embodiment of FIG. 3.
Figure 8:
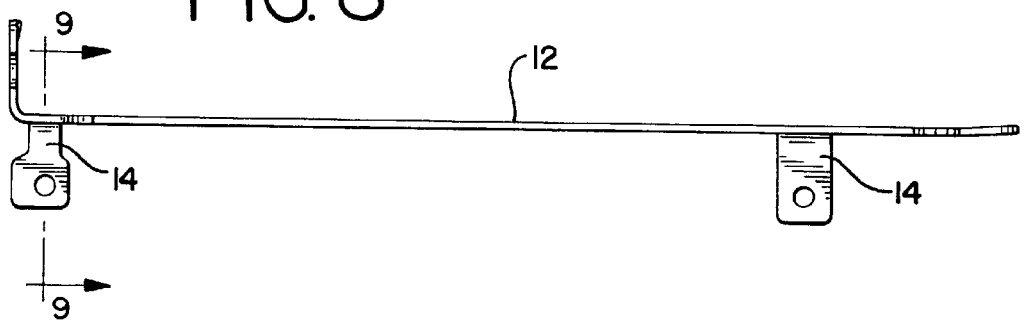
FIG. 8 is an end view of the embodiment of FIG. 7.
Figure 9:
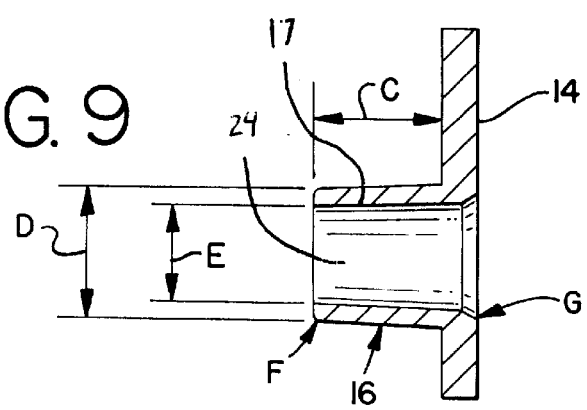
FIG. 9 is a sectional view taken through line 9—9 of FIG. 8.

Referring to FIGS. 7–9, a preferred embodiment of the bracket mounting apparatus 10 may, for example, include the following dimensions in inches: A=0725, B=4.725, C=0.123, D=0.124, E=0.094, F=Radius of 0.007, and G=Radius of 0.015. Other dimensions may alternatively be used to allow the rivet-head 16 to be secured to various printed circuit boards.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A bracket mounting apparatus comprising:

A bracket body having a length and an edge portion extending along the length, the bracket body further including a planar surface for aligning and retaining a printed circuit board, at least one planar bracket arm extending outward from the bracket body and offset from the edge portion, the at least one bracket arm including a first end unitary with the bracket body and a free second end opposite the first end, wherein the at least one bracket arm is a planar member and wherein the first end and the free second end lie in the same plane, the at least one bracket arm including an outer contact surface for contacting the printed circuit board, and an integrally formed rivet-head extending from the outer contact surface of the bracket arm, the integrally formed rivet-head including a cylindrical body portion including a first opening formed therein to receive a rivet punch, the first opening including a first diameter, the cylindrical body portion including a second opening opposite the first opening, the second opening including a second diameter, the second diameter being different from the first diameter, the cylindrical body portion further including an end portion wherein the end portion is bent into contact with the printed circuit board by the rivet punch to secure the outer contact surface of the bracket arm to the printed circuit board and wherein the printed circuit board contacts the planar surface of the bracket body when the printed circuit board is secured to the outer contact surface.

2. The apparatus of claim 1 wherein the at least one bracket arm comprises first and second bracket arms extending substantially perpendicular from the bracket body.

3. The apparatus of claim 1 wherein the bracket mounting apparatus is comprised of steel.

4. The apparatus of claim 1 wherein the rivet-head is sized to conform to standardized rivet-head machines.

5. The apparatus of claim 1 wherein the rivet-head extends approximately 0.123 inches from the bracket arm.

6. The apparatus of claim 1 wherein the cylindrical body portion includes an outer diameter, the outer diameter of the cylindrical body portion is approximately 0.124 inches.

7. The apparatus of claim 6 wherein the cylindrical body portion includes an inner diameter, the inner diameter of the cylindrical body portion is approximately 0.094 inches.

8. The apparatus of claim 1 wherein the bracket body and bracket arm are formed as an integral member.

9. A bracket mounting apparatus comprising:

a bracket body portion having a length and an edge portion extending along the length, the bracket body portion further including a planar surface for aligning and retaining a printed circuit board, first and second planar bracket arm portions extending substantially perpendicular from the bracket body portion and offset from the edge portion, the first and second bracket arm portions each including a first end unitary with the bracket body and a free second end opposite the first end, wherein the first and second bracket arm portions each are planar members and wherein the first end and the free second end lie in the same plane, the first and second bracket arm portions each including an outer contact surface for contacting the printed circuit board, and an integrally formed rivet-head portion extending from the outer contact surface of each of the first and second bracket arm portions, the integrally formed rivet-head portion of each of the first and second bracket arm portions including a cylindrical body portion including a first opening formed therein to receive a rivet punch, the first opening including a first diameter, the cylindrical body portion including a second opening opposite the first opening, the second opening including a second diameter, the second diameter being different from the first diameter, the cylindrical body portion further including an end portion wherein the Integrally formed rivet-head portion extending from the outer contact surface of each of the first and second bracket arm portions aligns with openings formed adjacent an end of the printed circuit board and wherein the end portion is bent into contact with the circuit board by the rivet punch to secure the outer contact surface of each of the first and second bracket arm portions to the printed circuit board and wherein the printed circuit board contacts the planar surface of the bracket body when the printed circuit board is secured to the outer contact surface.

10. The apparatus of claim 9 wherein the bracket body portion is comprised of steel.

11. The apparatus of claim 9 wherein the integrally formed rivet-head portion is sized to conform to standardized rivet-head machines.

12. The apparatus of claim 9 wherein the integrally formed rivet-head portion of each of the first and second bracket arm portions extends approximately 0.123 inches from the first and second bracket arm portions.

13. The apparatus of claim 9 wherein the cylindrical body portion includes an outer diameter, the outer diameter of the cylindrical body portion is approximately 0.124 inches.

14. The apparatus of claim 13 wherein the cylindrical body portion includes an inner diameter, the inner diameter of the cylindrical body portion is approximately 0.094 inches.

15. A method of attaching a bracket mounting apparatus to a printed circuit board comprising:

providing a bracket body having a length and an edge portion extending along the length, the bracket body further including a planar surface, at least one planar bracket arm extending outward from the bracket body and offset from the edge portion, the at least one bracket arm including a first end unitary with the bracket body and a free second end opposite the first end, wherein the at least one bracket arm is a planar member and wherein the first end and the free second end lie in the same plane, the at least one bracket arm including an outer surface for contacting a printed circuit board, and an integrally formed rivet-head extending from the outer contact surface of the bracket arm, the integrally formed rivet-head including a cylindrical body portion including a first opening formed therein, the first opening including a first diameter, the cylindrical body portion including a second opening opposite the first opening, the second opening including a second diameter, the second diameter being different from the first diameter, the cylindrical body portion further including an end portion;

passing the rivet-head through an opening in the printed circuit board;

contacting the outer contact surface of the bracket arm against the printed circuit board;

contacting the printed circuit board against the planar surface of the bracket body thereby aligning the printed circuit board with the bracket body;

inserting a rivet punch into the first opening formed in the cylindrical body portion;

bending the end portion into contact with the circuit board;

securing the outer contact surface of the bracket arm to the printed circuit board; and retaining the printed circuit board against the planar surface of the bracket body.

* * * * *